US010608411B2

(12) United States Patent
Noda et al.

(10) Patent No.: US 10,608,411 B2
(45) Date of Patent: Mar. 31, 2020

(54) LIGHT-EMITTING DEVICE, METHOD FOR MANUFACTURING SAME, AND PROJECTOR

(71) Applicants: Seiko Epson Corporation, Tokyo (JP); Sophia School Corporation, Tokyo (JP)

(72) Inventors: Takafumi Noda, Matsumoto (JP); Katsumi Kishino, Akiruno (JP)

(73) Assignees: Seiko Epson Corporation (JP); Sophia School Corporation (JP)

(*) Notice: Subject to any disclaimer, the term of this patent is extended or adjusted under 35 U.S.C. 154(b) by 0 days.

(21) Appl. No.: 16/286,671

(22) Filed: Feb. 27, 2019

(65) Prior Publication Data

US 2019/0267775 A1     Aug. 29, 2019

(30) Foreign Application Priority Data

Feb. 28, 2018  (JP) ................. 2018-034450

(51) Int. Cl.
*H01S 5/22* (2006.01)
*H01S 5/026* (2006.01)
(Continued)

(52) U.S. Cl.
CPC ............... *H01S 5/22* (2013.01); *H01S 5/026* (2013.01); *H01S 5/0425* (2013.01); *H01S 5/105* (2013.01);
(Continued)

(58) Field of Classification Search
CPC .......... H01S 5/0425; H01S 5/105; H01S 5/22; H01S 5/2031; G03B 21/20
(Continued)

(56) References Cited

U.S. PATENT DOCUMENTS 5,231,049 A * 7/1993 Neugebauer ........ H01L 25/0753
                                                 148/DIG. 45
6,410,940 B1 * 6/2002 Jiang .................. B82Y 20/00
                                                 257/79
(Continued)

FOREIGN PATENT DOCUMENTS

JP   2002-365401 A   12/2002
JP   2005-251488 A    9/2005
(Continued)

*Primary Examiner* — Tuan N Nguyen
(74) *Attorney, Agent, or Firm* — Harness, Dickey & Pierce, P.L.C.

(57) ABSTRACT

A light-emitting device includes a substrate and a stack provided on the substrate. The stack includes a plurality of columnar portions each of which includes a first columnar portion and a second columnar portion which has a diameter smaller than a diameter of the first columnar portions. Each first columnar portion is provided between the substrate and the second columnar portions, and includes: a first semiconductor layer; a second semiconductor layer having a conductivity type different from a conductivity type of the first semiconductor layer; and a light-emitting layer provided between the first semiconductor layer and the second semiconductor layer and capable of generating light. The first semiconductor layer is provided between the substrate and the light-emitting layer. Each second columnar portion includes a third semiconductor layer having a conductivity type different from a conductivity type of the first semiconductor layer.

8 Claims, 10 Drawing Sheets

(51) Int. Cl.
*H01S 5/30*   (2006.01)
*H01S 5/042*  (2006.01)
*H01S 5/20*   (2006.01)
*H01S 5/10*   (2006.01)
*H01S 5/343*  (2006.01)
*G03B 21/20*  (2006.01)

(52) U.S. Cl.
CPC .......... *H01S 5/2031* (2013.01); *H01S 5/3063* (2013.01); *H01S 5/34333* (2013.01); *G03B 21/2033* (2013.01); *H01S 5/04252* (2019.08); *H01S 5/04257* (2019.08); *H01S 5/2027* (2013.01)

(58) Field of Classification Search
USPC .......................................... 372/50.1; 257/82
See application file for complete search history.

(56) References Cited

U.S. PATENT DOCUMENTS

| | | | |
|---|---|---|---|
| 9,362,717 B2 * | 6/2016 | Kikuchi | ................ B82Y 20/00 |
| 2005/0194896 A1 | 9/2005 | Sugita et al. | |
| 2006/0284187 A1 | 12/2006 | Wierer et al. | |

FOREIGN PATENT DOCUMENTS

| | | |
|---|---|---|
| JP | 2008-166567 A | 7/2008 |
| JP | 2013-009002 A | 1/2013 |
| WO | WO-2006-103938 A1 | 10/2006 |

* cited by examiner

LIGHT-EMITTING DEVICE, METHOD FOR MANUFACTURING SAME, AND PROJECTOR

Japanese Patent Application No. 2018-034450, filed on Feb. 28, 2018, is hereby incorporated by reference in its entirety.

BACKGROUND

The present disclosure relates to a light-emitting device, a method for manufacturing the same, and a projector.

Semiconductor lasers are expected to be next-generation light sources having high brightness. Among them, semiconductor lasers using nanostructures (nanocolumns) are expected to be capable of realizing high-power light emission with narrow radiation angle by a photonic crystal effect created by the nanostructures. Such a semiconductor laser can be used, for example, as a light source of a projector.

For example, JP-A-2008-166567 discloses a compound semiconductor device including a GaN nanocolumn (columnar portion) and having an Si substrate (substrate), an n-type layer (first semiconductor layer) provided above the Si substrate, an active layer (light-emitting layer) provided on top of the n-type layer, and a p-type layer (second semiconductor layer) provided on top of the active layer.

However, in the light-emitting device as described above, since the choices of the materials of each layer constituting the columnar portion are limited, it is difficult to obtain a difference in refractive index between the light-emitting layer and the second semiconductor layer, and the light generated in the light-emitting layer may leak to the side opposite to the substrate side.

SUMMARY

According to a first aspect of the disclosure, there is provided a light-emitting device including:
a substrate; and
a stack provided on the substrate,
the stack including a plurality of columnar portions,
each of the columnar portions including a first columnar portion and a second columnar portion which has a diameter smaller than a diameter of the first columnar portion, the first columnar portion being provided between the substrate and the second columnar portion,
each first columnar portion including:
a first semiconductor layer;
a second semiconductor layer having a conductivity type different from a conductivity type of the first semiconductor layer; and
a light-emitting layer provided between the first semiconductor layer and the second semiconductor layer and capable of generating light,
the first semiconductor layer being provided between the substrate and the light-emitting layer, and
each second columnar portion including a third semiconductor layer having a conductivity type different from a conductivity type of the first semiconductor layer.

According to a second aspect of the disclosure, there is provided a method for manufacturing a light-emitting device, the method including:
forming a plurality of first columnar structures each of which includes a first semiconductor layer, a light-emitting layer capable of generating light, and a second semiconductor layer having a conductivity type different from a conductivity type of the first semiconductor layer formed on a substrate in this order;
forming a light propagation layer between adjacent first columnar structures and on an end surface of the adjacent first columnar structures;
etching back the light propagation layer to expose a part of the end surface; and
forming a plurality of second columnar structures each of which includes a third semiconductor layer formed on the exposed part of the end surface by using the etched back light propagation layer as a mask, the third semiconductor layer having a conductivity type different from a conductivity type of the first semiconductor layer,
in forming the first columnar structures, each of the first columnar structures being formed so that the end surface becomes a facet surface, and
in forming the second columnar structures, each of the second columnar structures being formed to have a diameter smaller than a diameter of each of the first columnar structures.

According to a third aspect of the disclosure, there is provided a projector including the above light-emitting device.

DETAILED DESCRIPTION OF THE EMBODIMENT

Figure 1:
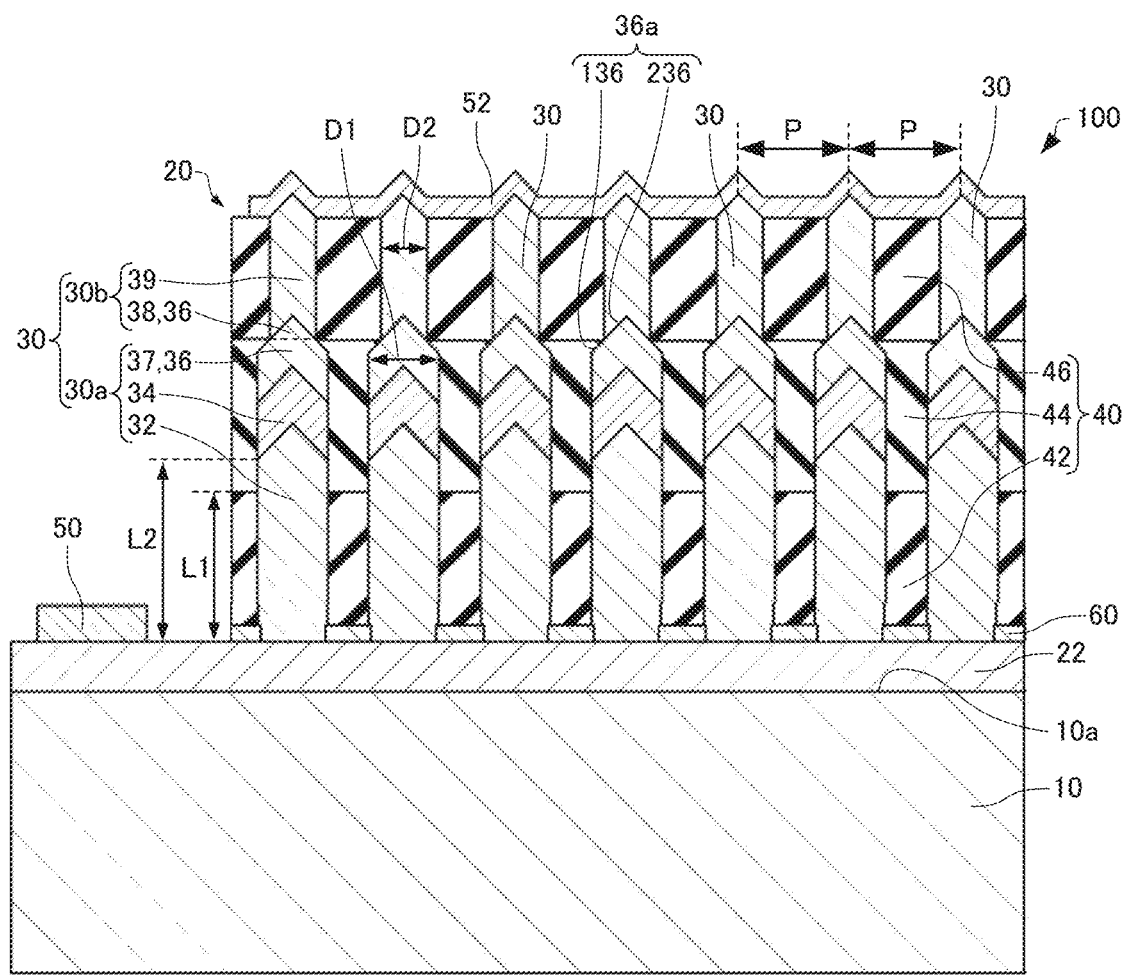
FIG. 1 is a cross-sectional view schematically illustrating a light-emitting device according to one embodiment of the disclosure.

According to one embodiment of the disclosure, there is provided a light-emitting device including:
a substrate; and
a stack provided on the substrate,
the stack including a plurality of first columnar portions and a plurality of second columnar portions each of which has a diameter smaller than a diameter of each of the first columnar portions,
each of the first columnar portions being provided between the substrate and one of the second columnar portions and including:
a first semiconductor layer;
a second semiconductor layer having a conductivity type different from a conductivity type of the first semiconductor layer; and
a light-emitting layer provided between the first semiconductor layer and the second semiconductor layer and capable of generating light,
the first semiconductor layer being provided between the substrate and the light-emitting layer, and
each of the second columnar portions including a third semiconductor layer having a conductivity type different from a conductivity type of the first semiconductor layer.

In the light-emitting device, a light propagation layer may be provided between two adjacent first columnar portions among the first columnar portions and between two adjacent second columnar portions among the second columnar portions.

In the light-emitting device, the light propagation layer may include:
a first layer provided between the first semiconductor layers of two adjacent first columnar portions among the first columnar portions; and
a second layer provided between the light-emitting layers of two adjacent first columnar portions among the first columnar portions, and
a refractive index of the second layer may be higher than a refractive index of the first layer.

In the light-emitting device, a distance between the second layer and the substrate may be smaller than a distance between the light-emitting layer and the substrate.

In the light-emitting device,
the light propagation layer may include a third layer provided between the third semiconductor layers of two adjacent second columnar portions among the second columnar portions, and
a refractive index of the third layer may be lower than the refractive index of the second layer.

In the light-emitting device,
the light-emitting layer may generate light of a wavelength λ,
the second columnar portions may be arranged with a pitch P, and
where N is an integer, the wavelength λ and the pitch P may satisfy a relationship:

$$P = N \times (\lambda/2).$$

According to one embodiment of the disclosure, there is provided a method for manufacturing a light-emitting device including:
forming a plurality of first columnar structures each of which includes a first semiconductor layer, a light-emitting layer capable of generating light, and a second semiconductor layer having a conductivity type different from a conductivity type of the first semiconductor layer formed on a substrate in this order;
forming a light propagation layer between two adjacent first columnar structures among the first columnar portions and on an end surface of each of the first columnar structures;
etching back the light propagation layer to expose a part of the end surface; and
forming a plurality of second columnar structures each of which includes a third semiconductor layer formed on the exposed part of the end surface by using the etched back light propagation layer as a mask, the third semiconductor layer having a conductivity type different from a conductivity type of the first semiconductor layer,
in forming the first columnar structures, each of the first columnar structures being formed so that the end surface becomes a facet surface, and
in forming the second columnar structures, each of the second columnar structures being formed to have a diameter smaller than a diameter of each of the first columnar structures.

According to one embodiment of the disclosure, there is provided a projector including the above light-emitting device.

Embodiments of the disclosure are described in detail below with reference to the drawings. Note that the following embodiments do not unduly limit the scope of the disclosure as stated in the claims. In addition, all of the elements described in connection with the following embodiments should not necessarily be taken as essential requirements of the disclosure.

1. Light-Emitting Device

First, a light-emitting device according to one embodiment of the disclosure will be described with reference to the drawings. FIG. 1 is a cross-sectional view schematically illustrating a light-emitting device 100 according to one embodiment of the disclosure.

As illustrated in FIG. 1, the light-emitting device 100 has a substrate 10, a stack 20, a first electrode 50, and a second electrode 52.

The substrate 10 has, for example, a plate-like shape. The substrate 10 is, for example, a Si substrate, a GaN substrate, a sapphire substrate, or the like. The substrate 10 has an upper surface 10a. The upper surface 10a is, for example, a flat surface.

The stack 20 is provided on the substrate 10 (on top of the substrate 10). The stack 20 has a buffer layer 22, a columnar portion 30, and a light propagation layer 40.

Here, "above" means in a direction away from the substrate 10 as viewed from a light-emitting layer 34 of the columnar portion 30 in the stacking direction of the stack 20 (hereinafter also simply referred to as "stacking direction"), and "under" means in a direction approaching the substrate 10 as viewed from the light-emitting layer 34 in the stacking direction.

The "stacking direction of the stack 20" means a stacking direction (vertical direction in the illustrated example) of the first semiconductor layer 32 and the light-emitting layer 34 of the columnar portion 30.

The buffer layer 22 is provided on top of the substrate 10. The buffer layer 22 is, for example, an n-type GaN layer (specifically, an n-type GaN layer doped with Si) or the like. In the illustrated example, a mask layer 60 for forming the columnar portion 30 is provided on top of the buffer layer 22. The mask layer is, for example, a silicon oxide layer, a silicon oxynitride layer, an aluminum oxide layer, a hafnium oxide layer, a titanium layer, a titanium oxide layer, a zirconium oxide layer, a silicon nitride layer, a laminated film thereof, or the like.

The columnar portion 30 is provided on top of the buffer layer 22. The planar shape (the shape seen from the stacking direction) of the columnar portion 30 is, for example, a polygon such as a hexagon, a circle, or the like. The diameter of the columnar portion 30 is, for example, on the order of nanometers, specifically 10 nm or more and 500 nm or less. The columnar portion 30 is also called, for example, a nanocolumn, a nanowire, a nanorod, or a nanopillar. The size of the columnar portion 30 in the stacking direction is, for example, 0.1 μm or more and 5 μm or less.

The "diameter" is a diameter when the planar shape of the columnar portion 30 is a circle, and in the case where the planar shape of the columnar portion 30 is a polygon, it is the diameter of the minimum circle (minimum enclosing circle) including the polygon therein.

A plurality of columnar portions 30 is provided. The plurality of columnar portions 30 are separated from each other. The interval between the adjacent columnar portions 30 is, for example, 1 nm or more and 500 nm or less. The plurality of columnar portions 30 are arranged with a predetermined pitch in a predetermined direction in a plan view (viewed from the stacking direction). The plurality of columnar portions 30 are disposed in, for example, a triangular lattice shape, a rectangular lattice shape, and the like in a plan view. The plurality of columnar portions 30 can demonstrate the photonic crystal effect.

Figure 2:
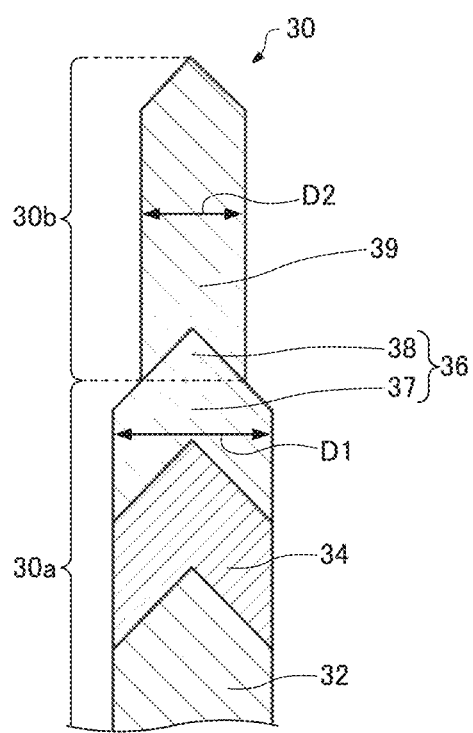
FIG. 2 is a cross-sectional view schematically illustrating a columnar portion of the light-emitting device according to one embodiment of the disclosure.

Here, FIG. 2 is a cross-sectional view schematically illustrating the columnar portion 30. As illustrated in FIGS. 1 and 2, the columnar portion 30 has a first columnar portion 30a and a second columnar portion 30b. The first columnar portion 30a is provided, for example, on top of the buffer layer 22. The first columnar portion 30a is provided between the substrate 10 and the second columnar portion 30b.

The second columnar portion 30b is provided on top of the first columnar portion 30a. The diameter D2 of the second columnar portion 30b is smaller than the diameter D1 of the first columnar portion 30a. The diameter D1 of the first columnar portion 30a is the maximum diameter of the first columnar portion 30a. The diameter D2 of the second columnar portion 30b is the maximum diameter of the second columnar portion 30b. In the illustrated example, the first columnar portion 30a has a portion with a constant diameter D1 in the stacking direction. The second columnar portion 30b has a portion with a constant diameter D2 in the stacking direction. Therefore, the columnar portion 30 has a stepped shape.

The first columnar portion 30a has a first semiconductor layer 32, a light-emitting layer 34, and a second semiconductor layer 36. In the illustrated example, the first columnar portion 30a includes the first semiconductor layer 32, the light-emitting layer 34, and a first portion 37 of the second semiconductor layer 36.

The first semiconductor layer 32 is provided on top of the buffer layer 22. The first semiconductor layer 32 is provided between the light-emitting layer 34 and the substrate 10. The first semiconductor layer 32 is, for example, an n-type GaN layer doped with Si.

The light-emitting layer 34 is provided on top of the first semiconductor layer 32. The light-emitting layer 34 is provided between the first semiconductor layer 32 and the second semiconductor layer 36. The light-emitting layer 34 has, for example, a quantum well structure composed of a GaN layer and an InGaN layer. The number of GaN layers and InGaN layers constituting the light-emitting layer 34 is not particularly limited. The light-emitting layer 34 is a layer capable of generating light as a result of current injection.

The first portion 37 of the second semiconductor layer 36 is provided on top of the light-emitting layer 34. The second semiconductor layer 36 has a conductivity type different from a conductivity type of the first semiconductor layer 32. The second semiconductor layer 36 is, for example, a p-type GaN layer doped with Mg.

The second columnar portion 30b has a third semiconductor layer 39. In the illustrated example, the second columnar portion 30b has a second portion 38 of the second semiconductor layer 36 and the third semiconductor layer 39.

The second portion 38 of the second semiconductor layer 36 is provided on top of the first portion 37. In the illustrated example, the second portion 38 has a triangular cross-sectional shape. As illustrated in FIG. 1, an upper surface 36a of the second semiconductor layer 36 is, for example, a facet surface, and is inclined with respect to the upper surface 10a of the substrate 10. Specifically, the upper surface 36a is inclined so that the distance between the upper surface 36a and the upper surface 10a becomes larger toward the center of the upper surface 36a. In the illustrated example, the upper surface 36a has a first region 136 in contact with the second layer 44 and a second region 236 in contact with the third semiconductor layer 39. Similarly, the upper surfaces of the first semiconductor layer 32, the light-emitting layer 34, and the third semiconductor layer 39 are, for example, facet surfaces.

The third semiconductor layer 39 is provided on top of the second semiconductor layer 36. The third semiconductor layer 39 has a conductivity type different from a conductivity type of the first semiconductor layer 32. The material of the third semiconductor layer 39 is, for example, the same as that of the second semiconductor layer 36. The semiconductor layers 32, 36, and 39 are cladding layers having a function of confining light in the light-emitting layer 34 (preventing light from leaking from the light-emitting layer 34).

An average refractive index (first average refractive index) in the planar direction (direction orthogonal to the stacking direction) of the portion where the second columnar portion 30b of the stack 20 is provided is lower than the average refractive index (second average refractive index) in the planar direction of the portion where the second semiconductor layer 36 of the first columnar portion 30a of the stack 20 is provided.

Here, the "average refractive index in the planar direction" is an average refractive index in a direction orthogonal to the stacking direction at a predetermined position in the stacking direction. For example, where the average refractive index in the planar direction of the portion wherein the columnar portion 30 of the stack 20 is provided is denoted by $n_{AVE}$, the $n_{AVE}$ is expressed by a following formula (1).

$$n_{AVE} = \sqrt{\varepsilon_A \cdot \phi + \varepsilon_B (1-\phi)} \quad (1)$$

In the above formula (1), $\varepsilon_A$ is a dielectric constant of the columnar portion 30. In the case of the first average refractive index, $\varepsilon_A$ is the refractive index of the second columnar portion 30b, and in the case of the second average refractive index, $\varepsilon_A$ is the refractive index of the second semiconductor layer 36 of the first columnar portion 30a. $\varepsilon_B$ is a dielectric constant of the light propagation layer 40. $\phi$ is the ratio $S_A/S$, where S is the cross-sectional area of the stack 20 in the planar direction at a predetermined position in the stacking direction and $S_A$ is the sum of the cross-sectional areas of the columnar portions 30 in the planar direction.

The second columnar portions 30b are arranged with a pitch P in a predetermined direction. When the light-emitting layer 34 generates light of a wavelength λ, where N is an integer, the wavelength λ and the pitch P satisfy the following formula (2).

$$P = N \times (\lambda/2) \tag{2}$$

The pitch P is, for example, the distance between the centers of the adjacent second portions 38 in a predetermined direction. Similarly, the first columnar portions 30 are arranged, for example, with a pitch P in a predetermined direction, and the pitch satisfies the relationship of the formula (2).

As illustrated in FIG. 1, the light propagation layer 40 is provided between the adjacent columnar portions 30. The light propagation layer 40 is provided between the adjacent first columnar portions 30a and between the adjacent second columnar portions 30b. The light propagation layer 40 is provided on top of the mask layer 60. The refractive index of the light propagation layer 40 is, for example, lower than the refractive index of the columnar portion 30. The light generated in the light-emitting layer 34 can propagate through the light propagation layer 40. The light propagation layer 40 has, for example, a first layer 42, a second layer 44, and a third layer 46.

The first layer 42 is provided on top of the mask layer 60. The first layer 42 is provided between the substrate 10 and the second layer 44. In the illustrated example, the first layer 42 is provided between the first semiconductor layers 32 of the adjacent first columnar portions 30a.

The first layer 42 is, for example, a silicon oxide layer (for example, a $SiO_2$ layer), a silicon oxynitride layer (for example, a SiON layer), an aluminum oxide layer (for example, an $Al_2O_3$ layer), a hafnium oxide layer (for example, a $HfO_2$ layer) or the like.

The second layer 44 is provided on top of the first layer 42. The second layer 44 is provided between the first layer 42 and the third layer 46. In the illustrated example, the second layer 44 is provided between the light-emitting layers 34 of the adjacent first columnar portions 30a. Further, the second layer 44 is provided between the second semiconductor layers 36 of the adjacent first columnar portions 30a.

A distance L1 between the second layer 44 and the substrate 10 is, for example, smaller than a distance L2 between the light-emitting layer 34 and the substrate 10. The distance L1 is the shortest distance between the second layer 44 and the substrate 10. The distance L2 is the shortest distance between the light-emitting layer 34 and the substrate 10.

The refractive index of the second layer 44 is higher than the refractive index of the first layer 42. The second layer 44 is, for example, a titanium oxide layer (for example, a $TiO_2$ layer), a zirconium oxide layer (for example, a $ZrO_2$ layer), a silicon nitride layer (for example, a SiN layer), or the like.

The third layer 46 is provided on top of the second layer 44. In the illustrated example, the third layer 46 is provided between the third semiconductor layers 39 of the adjacent second columnar portions 30b.

The refractive index of the third layer 46 is lower than the refractive index of the second layer 44. The refractive index of the third layer 46 may be the same as the refractive index of the first layer 42. The material of the third layer 46 is, for example, the same as that of the first layer 42.

In the light-emitting device 100, a pin diode is constituted by the p-type third semiconductor layer 39, the second semiconductor layer 36, the light-emitting layer 34 not doped with impurities, and the n-type first semiconductor layer 32. The semiconductor layers 32, 36, and 39 have a band gap larger than that of the light-emitting layer 34. In the light-emitting device 100, when a forward bias voltage of the pin diode is applied between the first electrode 50 and the second electrode 52 (injection of a current), recombination of electrons and holes occurs in the light-emitting layer 34. Light emission occurs due to this recombination. Light generated in the light-emitting layer 34 propagates in the planar direction through the light propagation layer 40 due to the semiconductor layers 32, 36, and 39 to form a standing wave by the photonic crystal effect created by the plurality of columnar portions 30, and receives the gain in the light-emitting layer 34 to generate laser oscillation. Then, the light-emitting device 100 emits the +1st order diffracted light and −1st order diffracted light as laser light in the stacking direction (toward the second electrode 52 side and the substrate 10).

Although not shown in the figures, a reflective layer may be provided between the substrate 10 and the buffer layer 22 or under the substrate 10. The reflective layer is, for example, a distributed bragg reflector (DBR) layer. The reflective layer can reflect the light generated in the light-emitting layer 34, and the light-emitting device 100 can emit light only from the second electrode 52 side.

The first electrode 50 is provided on top of the buffer layer 22. The buffer layer 22 may be in ohmic contact with the first electrode 50. The first electrode 50 is electrically connected to the first semiconductor layer 32. In the illustrated example, the first electrode 50 is electrically connected to the first semiconductor layer 32 through the buffer layer 22. The first electrode 50 is one electrode for injecting a current into the light-emitting layer 34. For example, a stack obtained by stacking a Ti layer, an Al layer, and an Au layer in this order from the buffer layer 22 side is used as the first electrode 50. In the case of using an electrically conductive substrate 10, although not shown, the first electrode 50 may be provided under the substrate 10.

The second electrode 52 is provided on top of the third semiconductor layer 39. In the illustrated example, the second electrode 52 is further provided on top of the light propagation layer 40. The third semiconductor layer 39 may be in ohmic contact with the second electrode 52. The second electrode 52 is electrically connected to the semiconductor layers 36 and 39. The second electrode 52 is the other electrode for injecting a current into the light-emitting layer 34. As the second electrode 52, for example, indium tin oxide (ITO) is used.

The light-emitting device 100 has, for example, the following features.

In the light-emitting device 100, the stack 20 includes the plurality of columnar portions 30, each of the columnar portions 30 include the first columnar portion 30a and the second columnar portion 30b which has the diameter D2 smaller than the diameter D1 of the first columnar portion, the first columnar portion 30a is provided between the substrate 10 and the second columnar portion 30b, each first columnar portion 30a include the first semiconductor layer 32, the second semiconductor layer 36, and the light-emitting layer 34, and each the second columnar portion 30b include the third semiconductor layer 39. As a result, in the light-emitting device 100, as compared with the case where the diameter of the second columnar portion 30b is equal to or larger than the diameter of the first columnar portion 30a, the average refractive index (second average refractive index) in the planar direction in the portion where the second columnar portion 30b of the stack 20 is provided can be made lower than the average refractive index (first average refractive index) in the planar direction in the portion where the second semiconductor layer 36 of the first columnar portion 30a of the stack 20 is provided. Therefore, in the light-emitting device 100, the light generated in the light-emitting layer 34 is likely to be confined in the light-emitting layer 34 in the stacking direction, and the amount of light leaked upward (the side opposite to the substrate 10 side, the second electrode 52 side) can be reduced. As a result, in the light-emitting device 100, it is possible to prevent the light generated in the light-emitting layer 34 from being absorbed by the second electrode 52.

Further, in the light-emitting device 100, since a stepped shape is provided such that the diameter D2 of the second columnar portion 30b is smaller than the diameter D1 of the first columnar portion 30a, the average refractive index in the planar direction in the p-type semiconductor layer (for example, a layer including the semiconductor layers 36 and 39) abruptly changes upward, as compared, for example, with the case in which the entire p-type semiconductor layer has a tapered shape such that the diameter gradually decreases upward. Therefore, in the light-emitting device 100, the light generated in the light-emitting layer 34 is more likely to be confined in the light-emitting layer 34 in the stacking direction, and the amount of light leaked upward can be reduced.

As described above, in the light-emitting device 100, the light generated in the light-emitting layer 34 is easily confined in the light-emitting layer 34 in the stacking direction, and the amount of light leaked upward (the side opposite to the substrate 10 side, the second electrode 52 side) can be reduced. Therefore, in the light-emitting device 100, the light generated in the light-emitting layer 34 can be prevented from being absorbed by the second electrode 52.

In the light-emitting device 100, the light propagation layer 40 is provided between adjacent first columnar portions 30a and between adjacent second columnar portions 30b. Therefore, in the light-emitting device 100, the light generated in the light-emitting layer 34 can propagate through the light propagation layer 40.

In the light-emitting device 100, the light propagation layer 40 includes the first layer 42 provided between adjacent first semiconductor layers 32, and the second layer 44 provided between adjacent light-emitting layers 34, and the refractive index of the second layer 44 is higher than the refractive index of the first layer 42. Therefore, in the light-emitting device 100, as compared with, for example, the case where the refractive index of the second layer 44 is equal to or lower than the refractive index of the first layer 42, the average refractive index in the planar direction in the portion where the second layer 44 of the stack 20 is provided can be made higher than the average refractive index in the planar direction in the portion where the first layer 42 of the stack 20 is provided. As a result, in the light-emitting device 100, the light generated in the light-emitting layer 34 is easily confined in the light-emitting layer 34 in the stacking direction, and the amount of light leaked to the substrate 10 side can be reduced.

In the light-emitting device 100, the distance L1 between the second layer 44 and the substrate 10 is smaller than the distance L2 between the light-emitting layer 34 and the substrate 10. Therefore, in the light-emitting device 100, the side surface of the light-emitting layer 34 can be more surely covered with the second layer 44.

In the light-emitting device 100, the light propagation layer 40 includes the third layer 46 provided between adjacent third semiconductor layers 39, and the refractive index of the third layer 46 is lower than the refractive index of the second layer 44. Therefore, in the light-emitting device 100, as compared with the case where the refractive index of the third layer 46 is equal to or higher than the refractive index of the second layer 44, the second average refractive index can be made lower than the first average refractive index.

Figure 3:
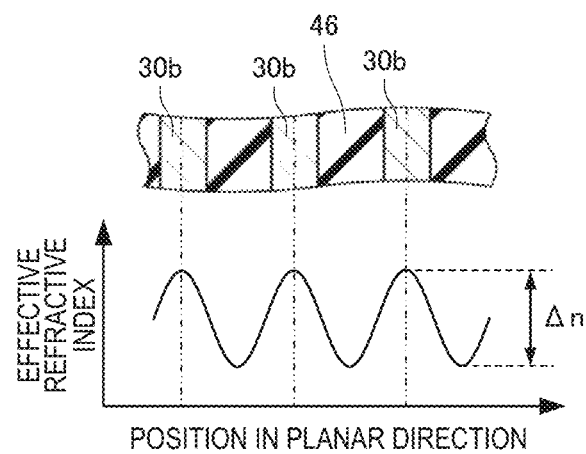
FIG. 3 is a diagram for explaining an effective refractive index.

Further, in the light-emitting device 100, the diameter of the second columnar portion 30b is smaller than the diameter of the first columnar portion 30a. Therefore, for example, as illustrated in FIG. 3, in the light propagating in the second columnar portion 30b in the plane direction, a difference $\Delta n$ between the effective refractive index of the second columnar portion 30b and the effective refractive index of the third layer 46 can be increased. As a result, in the light-emitting device 100, the photonic crystal effect can be improved.

Figure 4:
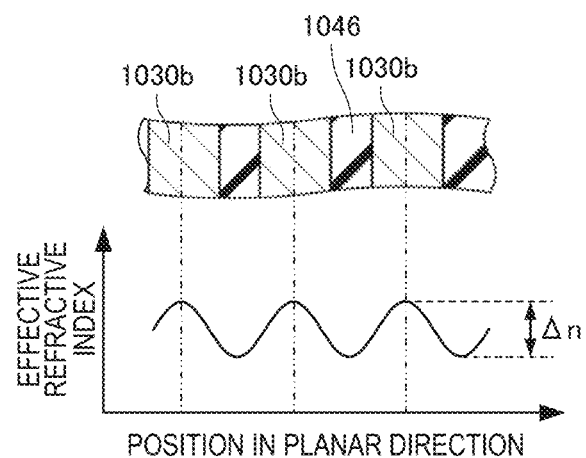
FIG. 4 is a diagram for explaining the effective refractive index.

For example, as illustrated in FIG. 4, when the diameter of a second columnar portion 1030b is the same as the diameter of the first columnar portion, the effective refractive index of the second columnar portion 1030b is easily affected by the effective refractive index of the third layer 1046, and the difference $\Delta n$ becomes smaller as compared with the case illustrated in FIG. 3.

Further, FIG. 3 is a diagram for explaining the effective refractive index in the light propagating in the second columnar portion 30b in the planar direction when the diameter of the second columnar portion 30b is smaller than the diameter of the first columnar portion 30a. FIG. 4 is a diagram for explaining the effective refractive index of light propagating in the second columnar portion 1030b in the planar direction when the diameter of the second columnar portion 1030b is the same as the diameter of the first columnar portion. In FIG. 3, the position of the center of the second columnar portion 30b is indicated by a two-dotted broken line. In FIG. 4, the position of the center of the second columnar portion 1030b is indicated by a two-dotted broken line.

In the light-emitting device 100, the relation of the above formula (2) is satisfied. Therefore, in the light-emitting device 100, the photonic crystal effect can be improved in the light propagating in the second columnar portion 30b in the planar direction. Furthermore, in the light-emitting device 100, since the diameter of the second columnar portion 30b is smaller than the diameter of the first columnar portion 30a, the difference $\Delta n$ can be increased as illustrated in FIG. 3. Therefore, in the light-emitting device 100, the photonic crystal effect can be further improved in the light propagating in the second columnar portion 30b in the planar direction.

Described hereinabove is the light-emitting device 100 in which light emission is induced by injecting a current into the light-emitting layer. However, the light-emitting device 100 may be a light-emitting device of a light excitation type in which light emission is induced by irradiating the light-emitting layer with light. In this case, the first electrode and the second electrode may not be provided. Also, the third layer may not be provided.

2. Method for Manufacturing Light-Emitting Device

Figure 5:
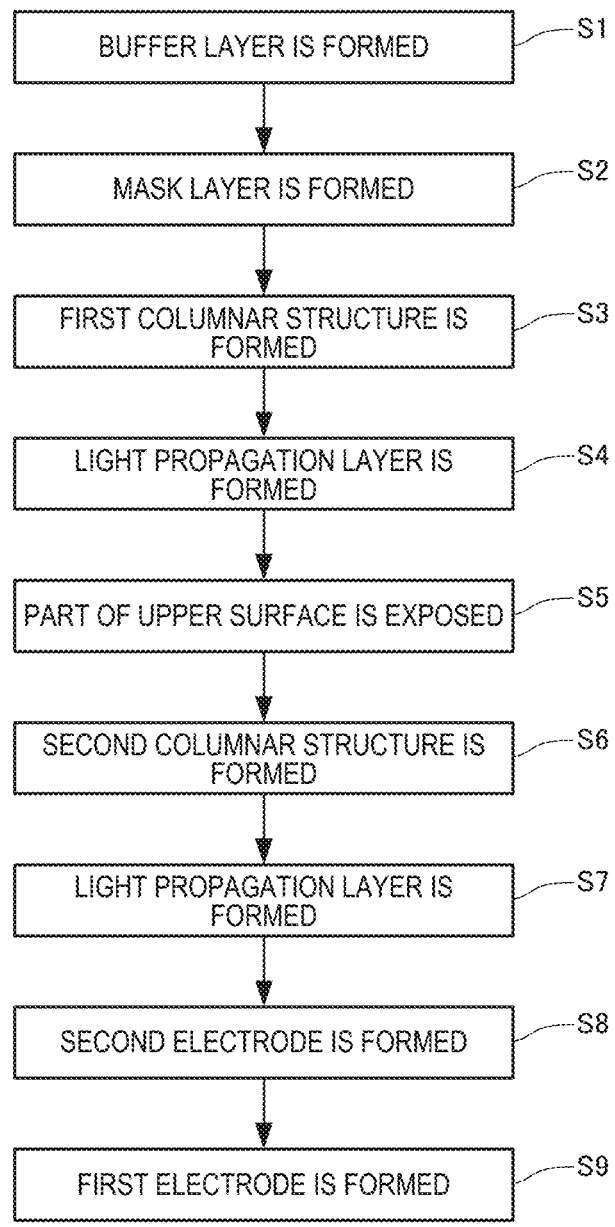
FIG. 5 is a flowchart for explaining a method for manufacturing the light-emitting device according to one embodiment of the disclosure.

Next, a method for manufacturing the light-emitting device 100 according to one embodiment of the disclosure will be described with reference to the drawings. FIG. 5 is a flowchart for explaining the method of manufacturing the light-emitting device 100 according to one embodiment of the disclosure. FIGS. 6 to 9 are cross-sectional views schematically illustrating steps of manufacturing the light-emitting device 100 according to one embodiment of the disclosure.

Figure 6:
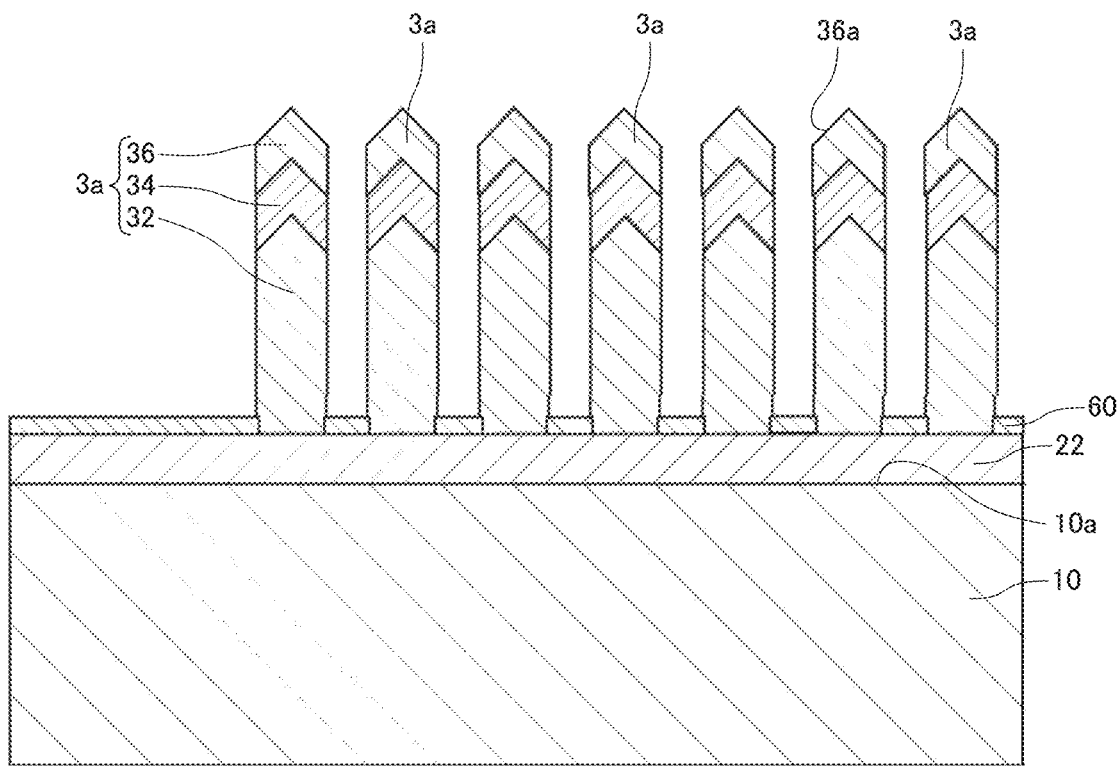
FIG. 6 is a cross-sectional view schematically illustrating a method for manufacturing the light-emitting device according to one embodiment of the disclosure.

As illustrated in FIG. 6, the buffer layer 22 is formed on top of the substrate 10 (step S1). Specifically, the buffer layer 22 is epitaxially grown on top of the substrate 10. Examples of a method for epitaxial growth include an metal organic chemical vapor deposition (MOCVD) method, an molecular beam epitaxy (MBE) method, and the like.

Next, the mask layer 60 is formed on top of the buffer layer 22 (step S2). The mask layer 60 is formed by film formation by the MOCVD method, the MBE method or the like, and patterning (patterning by photolithography technique and etching technique).

Next, the first semiconductor layer 32, the light-emitting layer 34, and the second semiconductor layer 36 are formed in this order on top of the buffer layer 22 (on the substrate 10 with the buffer layer 22 interposed therebetween) to form a plurality of first columnar structures 3a (step S3). Specifically, the first semiconductor layer 32, the light-emitting layer 34, and the second semiconductor layer 36 are epitaxially grown in this order on top of the buffer layer 22 by using the mask layer 60 as a mask. As a method for epitaxial growth, for example, the MOCVD method, the MBE method and the like can be mentioned.

In the step of forming the first columnar structures 3a, the first columnar structures 3a are formed so that the upper surface (end surface) of each first columnar structure 3a is a facet surface. In the illustrated example, the upper surface of the first columnar structure 3a is the upper surface 36a of the second semiconductor layer 36. When the first semiconductor layer 32, the light-emitting layer 34, and the second semiconductor layer 36 are grown by the MOCVD method or the MBE method, the upper surface of the first semiconductor layer 32, the upper surface of the light-emitting layer 34, and the upper surface 36a of the second semiconductor layer 36 can be made a faceted surface.

Figure 7:
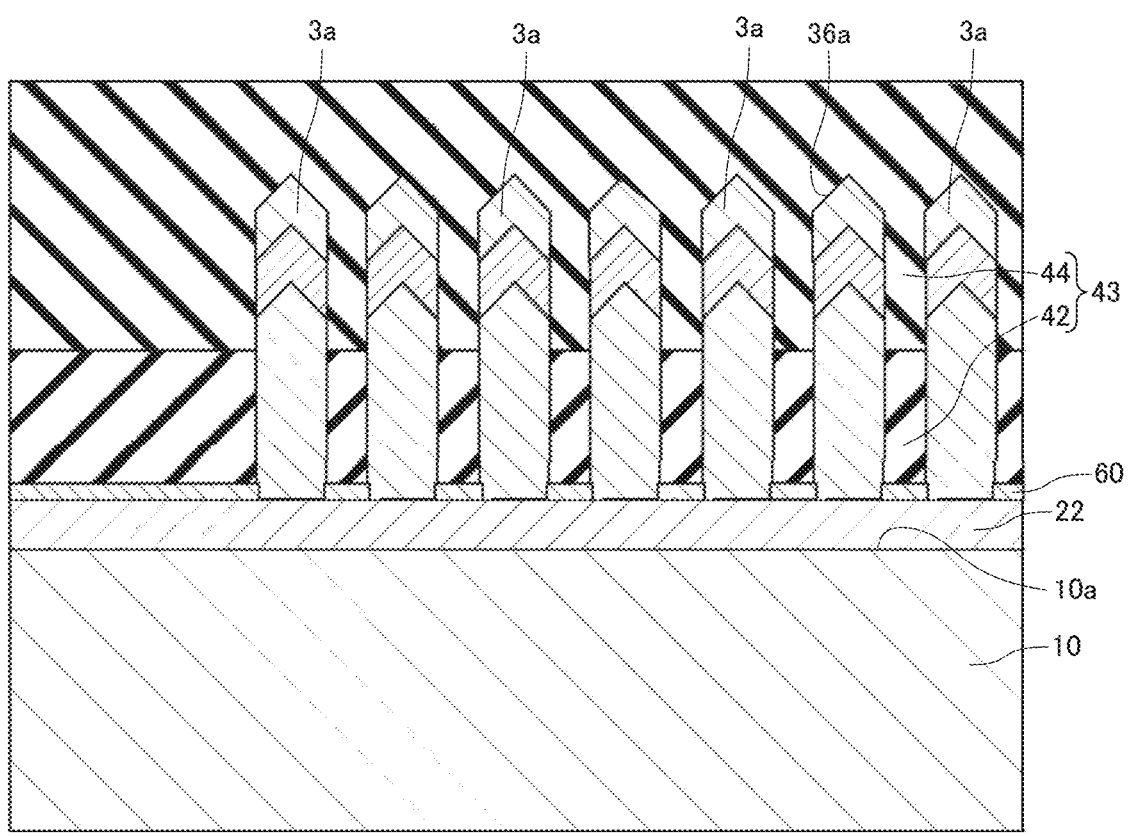
FIG. 7 is a cross-sectional view schematically illustrating a method for manufacturing the light-emitting device according to one embodiment of the disclosure.

As illustrated in FIG. 7, the light propagation layer 43 is formed between the adjacent first columnar structures 3a and on the upper surface (end surface) 36a of the first columnar structures 3a (step S4). The light propagation layer 43 is formed on the side and on top of the first columnar structures 3a. The light propagation layer 43 has the first layer 42 and the second layer 44. Specifically, first, the first layer 42 is formed on top of the buffer layer 22. Next, the second layer 44 is formed on top of the first layer 42 and on top of the first columnar structures 3a. The first layer 42 is formed by, for example, a spin coating method, a chemical vapor deposition (CVD) method, or the like.

Figure 8:
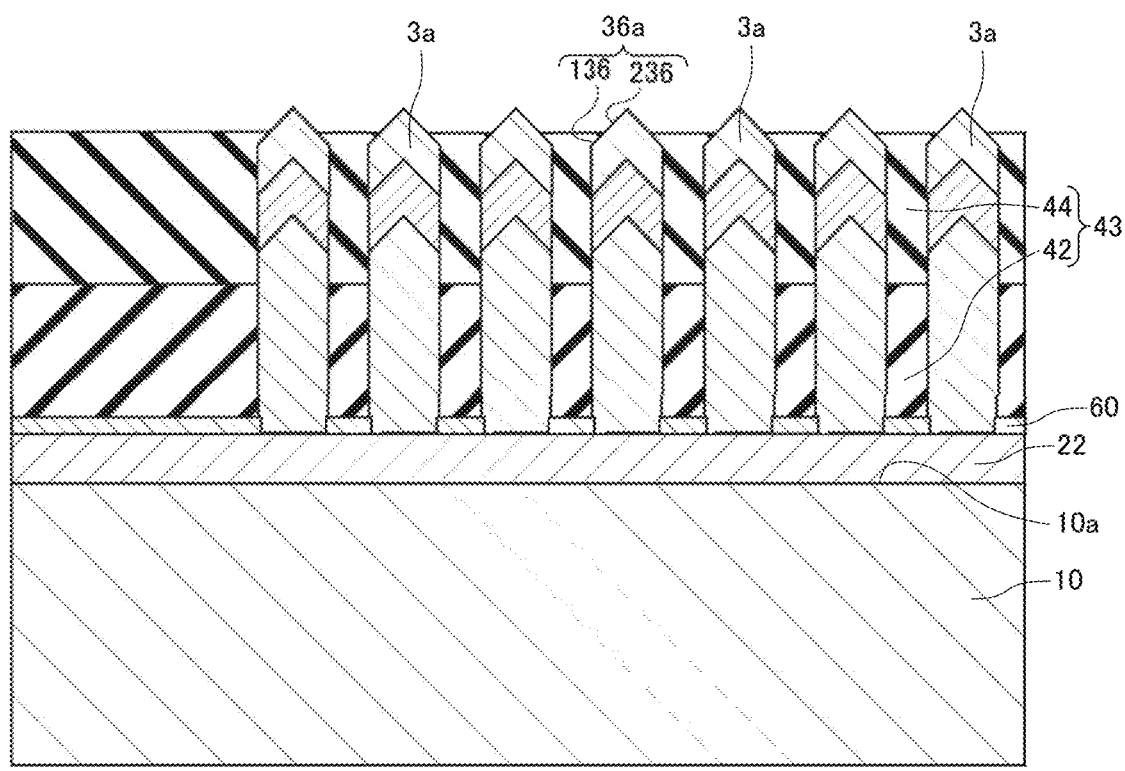
FIG. 8 is a cross-sectional view schematically illustrating a method for manufacturing the light-emitting device according to one embodiment of the disclosure.

As illustrated in FIG. 8, the second layer 44 is etched back to expose a part (a second region 236) of the upper surface 36a (step S5). Since the upper surface 36a is a facet surface inclined with respect to the upper surface 10a, it is possible to expose only the second region 236 in a state where the first region 136 is covered with the second layer 44.

Figure 9:
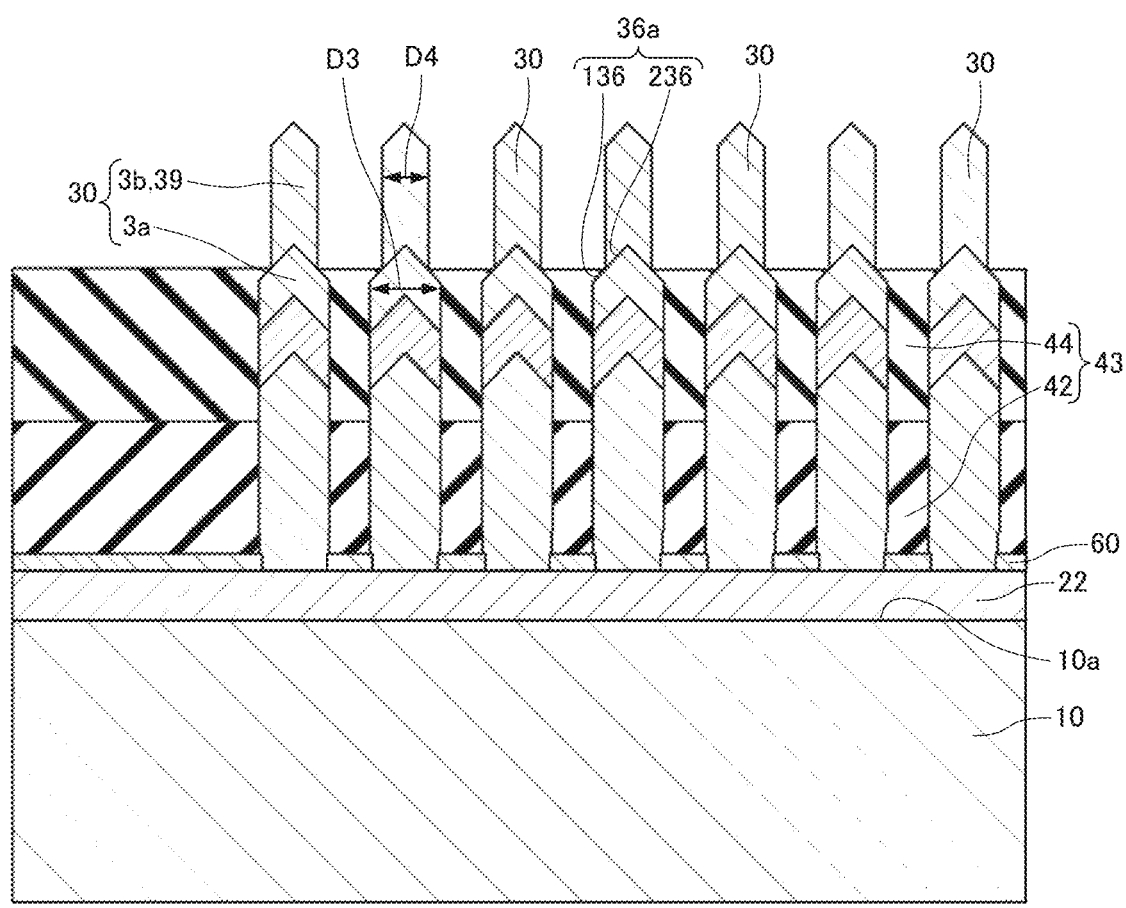
FIG. 9 is a cross-sectional view schematically illustrating a method for manufacturing the light-emitting device according to one embodiment of the disclosure.

As illustrated in FIG. 9, the third semiconductor layer 39 is formed in the exposed second region 236 by using the etched back second layer 44 as a mask to form second columnar structures 3b (step S6). Specifically, the third semiconductor layer 39 is epitaxially grown using the second layer 44 as a mask. As a method for epitaxial growth, for example, the MOCVD method, the MBE method and the like can be mentioned.

In the step of forming the second columnar structures 3b, the second columnar structures 3b are formed so that the diameter D4 of the second columnar structure 3b is smaller than the diameter D3 of the first columnar structure 3a. The diameter D3 of the first columnar structure 3a is the maximum diameter of the first columnar structure 3a. The diameter D4 of the second columnar structure 3b is the maximum diameter of the second columnar structure 3b. Through this step, the columnar portion 30 having the first columnar structure 3a and the second columnar structure 3b can be formed.

As illustrated in FIG. 1, the third layer 46 is formed between the adjacent second columnar structures 3b to form the light propagation layer 40 (step S7). The first layer 42 is formed by, for example, the spin coating method, the CVD method, or the like. Through this step, the stack 20 can be formed.

Next, the second electrode 52 is formed on top of the columnar portion 30 and on top of the light propagation layer 40 (step S8). The second electrode 52 is formed by, for example, the sputtering method or the vacuum deposition method.

Next, the light propagation layer 40 and the mask layer 60 are patterned to expose the buffer layer 22, and then the first electrode 50 is formed on top of the buffer layer 22 (step S9). The first electrode 50 is formed by, for example, the sputtering method or the vacuum deposition method. The order of the step of forming the first electrode 50 and the step of forming the second electrode 52 is not limited.

Through the above steps, the light-emitting device 100 can be manufactured.

The method for manufacturing the light-emitting device 100 has, for example, the following features.

The method for manufacturing the light-emitting device 100 has etching back the light propagation layer 43 to expose the second region 236 on the upper surface 36a and forming the plurality of second columnar structures 3b each of which includes the third semiconductor layer 39 formed on the exposed second region 236 by using the etched back light propagation layer 43 as a mask. In forming the second columnar structures 3b, each of the second columnar structures 3b is formed to have the diameter D4 smaller than the diameter D3 of each of the first columnar structure 3a. Therefore, it is possible to provide a method for manufacturing the light-emitting device 100 in which the light generated in the light-emitting layer 34 is likely to be confined in the light-emitting layer 34 in the stacking direction, and the amount of light leaked upward (the side opposite to the substrate 10 side, the second electrode 52 side) can be reduced.

Furthermore, in the method for manufacturing the light-emitting device 100, the light propagation layer 43 is made to function as a mask (selective growth film), thereby making it possible to form the second columnar structures 3b to be self-aligned with respect to the first columnar structures 3a.

Furthermore, the method for manufacturing the light-emitting device 100 has a step of forming the first semiconductor layer 32, the light-emitting layer 34, and the second semiconductor layer 36 in this order on the substrate 10 to form a plurality of the first columnar structures 3a. Therefore, the first semiconductor layer 32, the light-emitting layer 34, and the second semiconductor layer 36 can be continuously formed with a single device. Thereby, the interface between the first semiconductor layer 32 and the light-emitting layer 34 and the interface between the light-emitting layer 34 and the second semiconductor layer 36, which greatly affect the light emission characteristics, can be prevented from oxidation, and impurities can be prevented from adhering to these interfaces.

3. Modification of Light-Emitting Device

Figure 10:
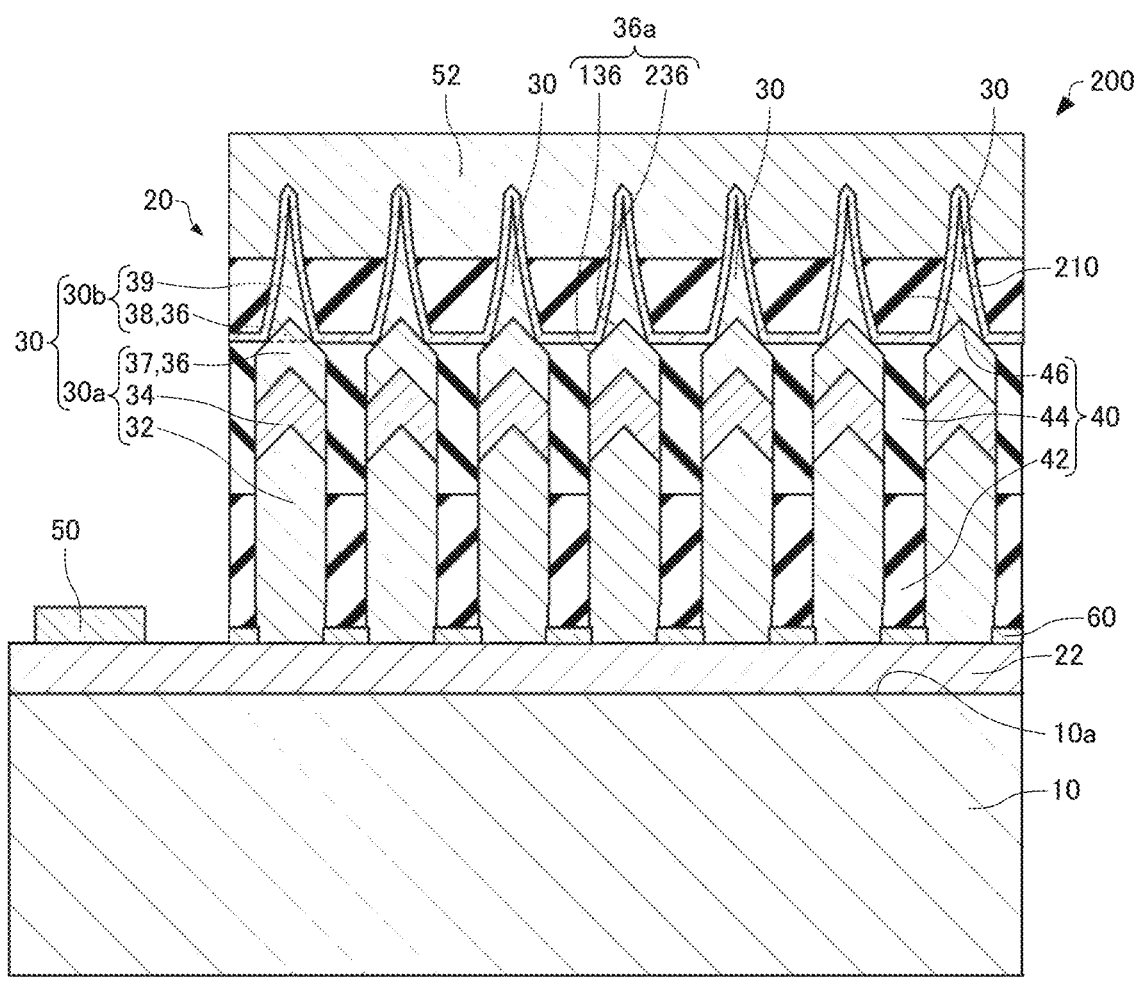
FIG. 10 is a cross-sectional view schematically illustrating a method for manufacturing the light-emitting device according to one embodiment of the disclosure.

Next, a light-emitting device according to a modification of the above-described embodiment of the disclosure will be described with reference to the drawings. FIG. 10 is a cross-sectional view schematically illustrating a light-emitting device 200 according to a modification of the above-described embodiment of the disclosure. Hereinafter, in the light-emitting device 200, the members having the same functions as the constituent members of the above-described light-emitting device 100 will be assigned with the same reference numerals, and detailed description thereof will be omitted.

In the above-described light-emitting device 100, the material of the third semiconductor layer 39 is the same as that of the second semiconductor layer 36. In contrast, in the light-emitting device 200, as illustrated in FIG. 10, the material of the third semiconductor layer 39 is different from that of the second semiconductor layer 36.

In the light-emitting device 200, the second semiconductor layer 36 has a superlattice structure composed of, for example, a p-type AlGaN layer doped with Mg and a p-type GaN layer doped with Mg. Alternatively, the second semiconductor layer 36 is a p-type AlGaN layer doped with Mg. The third semiconductor layer 39 is, for example, a p-type GaN layer doped with Mg. Since the second semiconductor layer 36 and the third semiconductor layer 39 are made of such materials, the third semiconductor layer 39 has a tapered shape with a diameter gradually decreasing upward.

The light-emitting device 200 has a conductive layer 210. The conductive layer 210 is provided on the surface of the third semiconductor layer 39. Further, the conductive layer 210 is provided on top of the second layer 44. For example, an Au layer, a Ni layer, or a stack obtained by stacking a Ni layer and an Au layer in this order from the third semiconductor layer 39 side are used for the conductive layer 210. The thickness of the conductive layer 210 is, for example, 10 nm or less.

The third layer 46 is provided on top of the conductive layer 210. In the example illustrated in the drawing, the tip of the third semiconductor layer 39 protrudes upward from the third layer 46.

In the light-emitting device 200, the distal end of the third semiconductor layer 39 protrudes sharper as compared to the light-emitting device 100. Therefore, unless the thickness of the second electrode 52 is increased, the distal end of the third semiconductor layer 39 may protrude upward from the second electrode 52. However, with the third layer 46, it is possible to prevent the distal end of the third semiconductor layer 39 from protruding upward from the second electrode 52 even when the thickness of the second electrode 52 is not increased.

In the method for manufacturing the light-emitting device 200, the conductive layer 210 is formed on top of the surface of the third semiconductor layer 39 and the second layer 44 before forming the third layer 46. The conductive layer 210 is formed by, for example, the sputtering method. Next, after the third layer 46 is formed above the third semiconductor layer 39 and on the sides thereof so as to cover the conductive layer 210, the third layer 46 is etched by etch back, and a part of the conductive layer 210 is exposed. Next, the third layer 46 is formed on top of the conductive layer 210. Next, a second electrode 52 is formed on top of the third layer 46.

Figure 11:
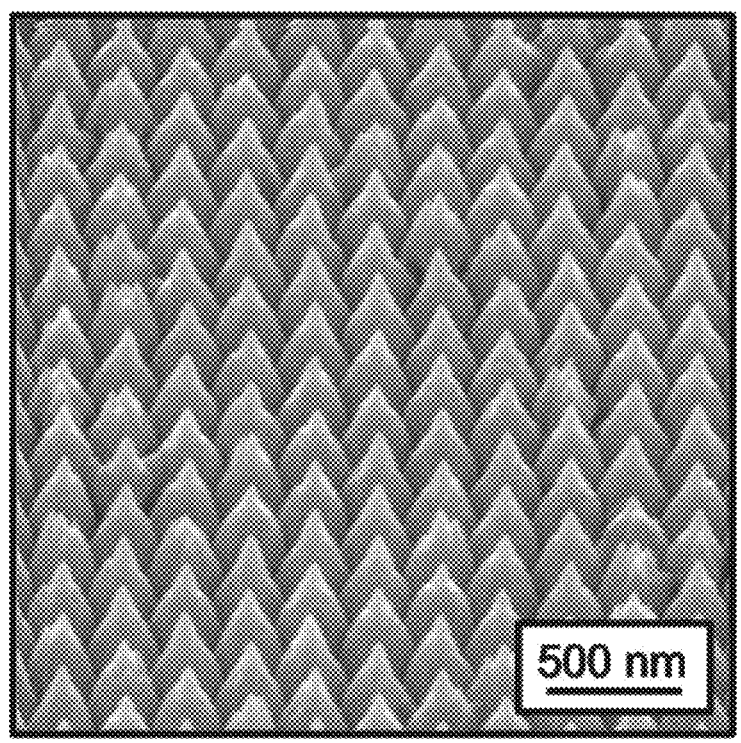
FIG. 11 is an observation image obtained by SEM.
Figure 12:
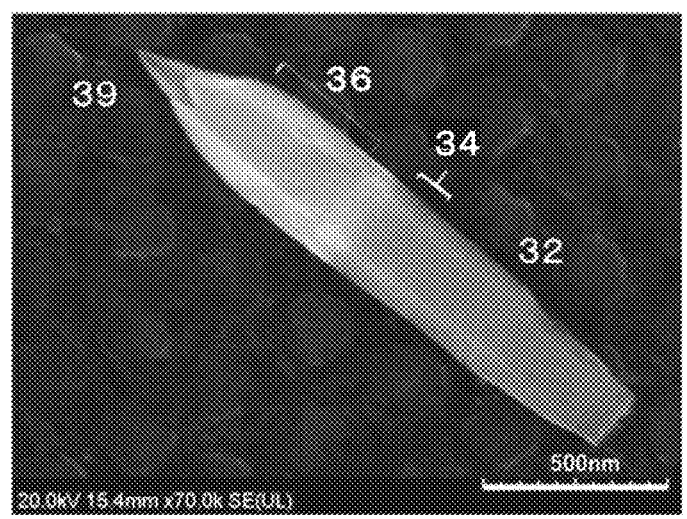
FIG. 12 is an observation image obtained by SEM.

Here, FIGS. 11 and 12 are observation images of a columnar portion corresponding to the light-emitting device 200 which are obtained by a scanning electron microscope (SEM). FIG. 12 is an observation image of the cross section of the columnar portion.

In FIG. 12, "32" is a portion corresponding to the first semiconductor layer 32 of the light-emitting device 200 and is an n-type GaN layer. "34" is a portion corresponding to the light-emitting layer 34 of the light-emitting device 200, and has a quantum well structure composed of a GaN layer and an InGaN layer. "36" is a portion corresponding to the second semiconductor layer 36 of the light-emitting device 200, and has a superlattice structure composed of a p-type AlGaN layer and a p-type GaN layer. "39" is a portion corresponding to the third semiconductor layer 39 of the light-emitting device 200, and is a p-type GaN layer.

4. Projector

Figure 13:
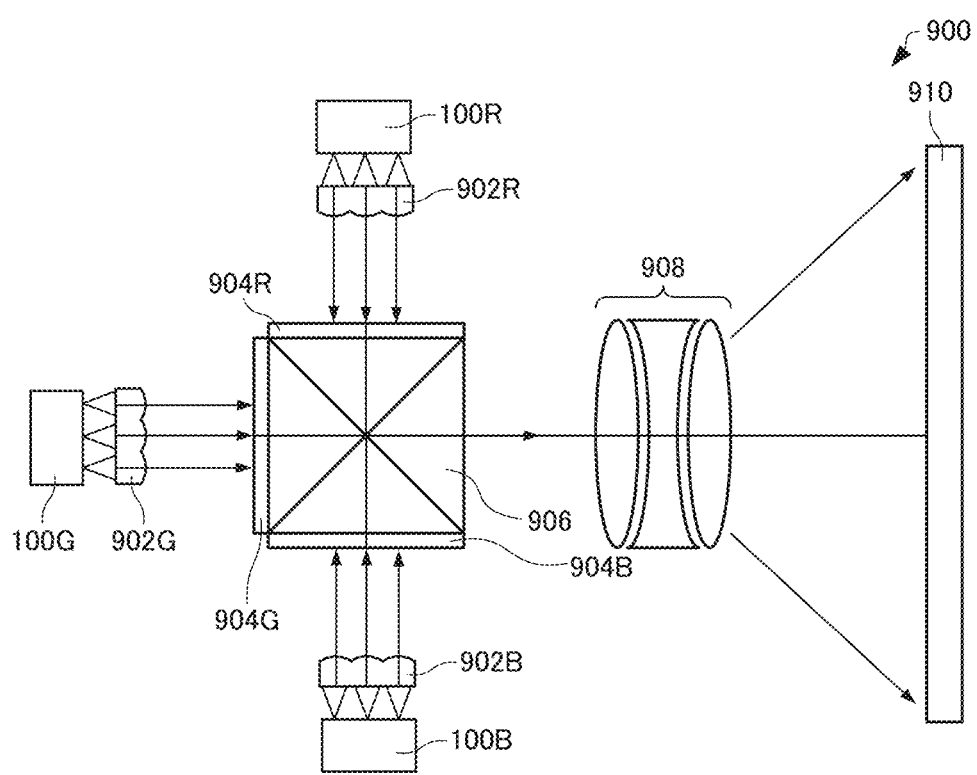
FIG. 13 is a diagram schematically illustrating a projector according to one embodiment of the disclosure.

Next, a projector according to one embodiment of the disclosure will be described with reference to the drawings. FIG. 13 is a diagram schematically illustrating a projector 900 according to the embodiment of the disclosure.

Hereinafter, the projector 900 having the light-emitting device 100 will be described.

The projector 900 includes a housing (not shown) and a red light source 100R, a green light source 100G, and a blue light source 100B that are provided in the housing and emit red light, green light, and blue light, respectively. Each of the red light source 100R, the green light source 100G, and the blue light source 100B is configured by, for example, arranging a plurality of light-emitting devices 100 in an array in a direction orthogonal to the stacking direction and using the substrate 10 as a common substrate for the plurality of light-emitting devices 100. The number of the light-emitting devices 100 constituting each of the light sources 100R, 100G, 100B is not particularly limited. For the sake of convenience, in FIG. 13, the housing constituting the projector 900 is omitted, and the light sources 100R, 100G, 100B are simplified.

The projector 900 further includes lens arrays 902R, 902G, 902B, transmissive liquid crystal light valves (light modulation devices) 904R, 904G, 904B, and a projection lens (projection device) 908 which are provided in the housing.

Light emitted from the light sources 100R, 100G, 100B is incident on the lens arrays 902R, 902G, 902B. The light emitted from the light sources 100R, 100G, 100B is condensed by the lens arrays 902R, 902G, 902B, and can be, for example, superimposed (partially superimposed). As a result, the liquid crystal light valves 904R, 904G, 904B can be irradiated with good uniformity.

The light condensed by each of the lens arrays 902R, 902G, 902B is incident on the respective liquid crystal light valves 904R, 904G, 904B. Each liquid crystal light valve 904R, 904G, 904B modulates the incident light according to respective image information. Then, the projection lens 908 magnifies the image (visual image) formed by the liquid crystal light valves 904R, 904G, 904B and projects the image on a screen (display surface) 910.

In addition, the projector 900 can include a cross dichroic prism (color light combining means) 906 which combines the light beams emitted from the liquid crystal light valves 904R, 904G, 904B and guides the combined light to the projection lens 908.

The three color light beams modulated by respective liquid crystal light valves 904R, 904G, 904B are incident on the cross dichroic prism 906. This prism is formed by pasting together four rectangular prisms, and a dielectric multilayer film that reflects red light and a dielectric multilayer film that reflects blue light are arranged in a cross shape on the inner surface of the prism. Three color light beams are combined by these dielectric multilayer films, and light representing a color image is formed. Then, the combined light is projected on the screen 910 by the projection lens 908 which is a projection optical system, and an enlarged image is displayed.

The light sources 100R, 100G, 100B may directly form a visual image, without using the liquid crystal light valves 904R, 904G, 904B, by controlling (modulating) the light-emitting devices 100 constituting the light sources 100R, 100G, 100B according to image information as pixels of the visual image. Further, the projection lens 908 may enlarge the visual image formed by the light sources 100R, 100G, 100B and project the enlarged image on the screen 910.

In the above example, the transmission type liquid crystal light valve is used as a light modulation device, but a light valve other than the liquid crystal light valve may also be used, or a reflection type light valve may be used. Such light valve can be exemplified by a reflection type liquid crystal light valve or a digital micro mirror device. Further, the configuration of the projection optical system can be appropriately changed according to the type of the light valve to be used.

Further, the light sources 100R, 100G, 100B can be also used in a light source device of a scanning type image display device (projector) such that has a scanning means which is an image forming device that displays an image of a desired size on a display surface by scanning the light from the light sources 100R, 100G, 100B on the screen.

Applications of the light-emitting device of the disclosure are not limited to the above-described embodiments, and the light-emitting device can be used as a light source not only for a projector, but also for indoor and outdoor illumination, backlight of a display, laser printers, scanners, car-mounted lights, sensing equipment using light, communication equipment and the like.

The above-described embodiments and modifications are examples and the disclosure is not limited thereto. For example, the embodiments and the modifications may be combined appropriately.

The disclosure includes configurations that are substantially the same (for example, in function, method, and results, or in objective and effects) as the configurations described in the embodiments. The disclosure also includes configurations in which non-essential elements described in the embodiments are replaced by other elements. The disclosure also includes configurations having the same effects as those of the configurations described in the embodiments, or configurations capable of achieving the same objectives as those of the configurations described in the embodiments. The disclosure further includes configurations obtained by adding known art to the configurations described in the embodiments.

Some embodiments of the disclosure have been described in detail above, but a person skilled in the art will readily appreciate that various modifications can be made from the embodiments without materially departing from the novel teachings and effects of the disclosure. Accordingly, all such modifications are assumed to be included in the scope of the disclosure.

What is claimed is:

1. A light-emitting device comprising:
    a substrate; and
    a stack provided on the substrate,
    the stack including a plurality of columnar portions,
    each of the columnar portions including a first columnar portion and a second columnar portion which has a diameter smaller than a diameter of the first columnar portion, the first columnar portion being provided between the substrate and the second columnar portion,
    each first columnar portion including:
        a first semiconductor layer;
        a second semiconductor layer having a conductivity type different from a conductivity type of the first semiconductor layer; and
        a light-emitting layer provided between the first semiconductor layer and the second semiconductor layer and capable of generating light,
        the first semiconductor layer being provided between the substrate and the light-emitting layer, and
    each second columnar portion including a third semiconductor layer having a conductivity type different from a conductivity type of the first semiconductor layer.

2. The light-emitting device according to claim 1, wherein a light propagation layer is provided between adjacent first columnar portions and between adjacent second columnar portions.

3. The light-emitting device according to claim 2, wherein the light propagation layer includes:
    a first layer provided between adjacent first semiconductor layers; and
    a second layer provided between adjacent light-emitting layers, and
    a refractive index of the second layer is higher than a refractive index of the first layer.

4. The light-emitting device according to claim 3, wherein a distance between the second layer and the substrate is smaller than a distance between the light-emitting layer and the substrate.

5. The light-emitting device according to claim 3, wherein the light propagation layer includes a third layer provided between adjacent third semiconductor layers, and
    a refractive index of the third layer is lower than the refractive index of the second layer.

6. The light-emitting device according to claim 1, wherein the light-emitting layer generates light of a wavelength $\lambda$, the second columnar portions are arranged with a pitch P, and
    where N is an integer, the wavelength $\lambda$ and the pitch P satisfy a relationship:

$$P = N \times (\lambda/2).$$

7. A projector comprising the light-emitting device according to claim 1.

8. A method for manufacturing a light-emitting device, the method comprising:
    forming a plurality of first columnar structures each of which includes a first semiconductor layer, a light-emitting layer capable of generating light, and a second semiconductor layer having a conductivity type different from a conductivity type of the first semiconductor layer formed on a substrate in this order;
    forming a light propagation layer between adjacent first columnar structures and on an end surface of the adjacent first columnar structures;
    etching back the light propagation layer to expose a part of the end surface; and
    forming a plurality of second columnar structures each of which includes a third semiconductor layer formed on the exposed part of the end surface by using the etched back light propagation layer as a mask, the third semiconductor layer having a conductivity type different from a conductivity type of the first semiconductor layer, in forming the first columnar structures, each of the first columnar structures being formed so that the end surface becomes a facet surface; and in forming the second columnar structures, each of the second columnar structures being formed to have a diameter smaller than a diameter of each of the first columnar structures.

* * * * *